United States Patent
Maruyama et al.

(10) Patent No.: US 11,294,284 B2
(45) Date of Patent: Apr. 5, 2022

(54) PHOTOSENSITIVE RESIN COMPOSITION AND PATTERN FORMING PROCESS

(71) Applicant: Shin-Etsu Chemical Co., Ltd., Tokyo (JP)

(72) Inventors: Hitoshi Maruyama, Annaka (JP); Tamotsu Oowada, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 231 days.

(21) Appl. No.: 16/459,905

(22) Filed: Jul. 2, 2019

(65) Prior Publication Data
US 2020/0026189 A1 Jan. 23, 2020

(30) Foreign Application Priority Data
Jul. 17, 2018 (JP) .............................. JP2018-134158

(51) Int. Cl.
| | | |
|---|---|---|
| *G03F 7/075* | (2006.01) | |
| *G03F 7/004* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC .......... *G03F 7/0757* (2013.01); *G03F 7/0043* (2013.01); *G03F 7/0045* (2013.01); *G03F 7/162* (2013.01); *G03F 7/168* (2013.01); *G03F 7/2002* (2013.01); *G03F 7/325* (2013.01); *G03F 7/38* (2013.01)

(58) Field of Classification Search
CPC .... G03F 7/0757; G03F 7/0043; G03F 7/0045; G03F 7/162; G03F 7/168; G03F 7/2002; G03F 7/325; G03F 7/38; G03F 7/20; G03F 7/0382; G03F 7/031; G03F 7/40; G03F 7/039; G03F 7/0047; G03F 7/0392; G03F 7/0048; G03F 7/105; G03F 7/027; G03F 7/0388; G03F 7/033; C09D 183/14; C09D 183/06; C08G 77/26; C08G 77/50; C08G 77/14; C08G 77/52; C08G 77/24; C08G 77/54; H05K 3/287; H05K 3/281; H05K 2201/0209; Y10T 428/24537; Y10T 428/24339; Y10T 428/12104; Y10T 428/12097; C08F 2/50; C07C 45/71; C07C 49/825; C07C 45/64; C07C 45/54; C07C 49/84; B33Y 70/00; G02F 1/133345
See application file for complete search history.

(56) References Cited

U.S. PATENT DOCUMENTS

| | | | |
|---|---|---|---|
| 6,590,010 B2 | 7/2003 | Kato et al. | |
| 7,785,766 B2 | 8/2010 | Kato et al. | |
| 2004/0034115 A1* | 2/2004 | Baudin | C07C 49/825 522/33 |
| 2011/0076465 A1 | 3/2011 | Takeda et al. | |
| 2013/0196114 A1* | 8/2013 | Urano | C09D 183/14 428/139 |
| 2014/0106137 A1 | 4/2014 | Kondo et al. | |
| 2016/0033865 A1 | 2/2016 | Takemura et al. | |
| 2016/0357105 A1 | 12/2016 | Asai et al. | |
| 2018/0107115 A1 | 4/2018 | Asai et al. | |
| 2018/0107116 A1 | 4/2018 | Asai et al. | |
| 2019/0049843 A1 | 2/2019 | Maruyama et al. | |

FOREIGN PATENT DOCUMENTS

| | | | | |
|---|---|---|---|---|
| EP | 1186624 A1 | 3/2002 | | |
| EP | 1953183 A3 | 11/2008 | | |
| EP | 2305754 A1 | 4/2011 | | |
| EP | 2980172 A1 | 2/2016 | | |
| EP | 3103831 A1 | 12/2016 | | |
| EP | 3309613 A1 | 4/2018 | | |
| EP | 3309615 A1 | 4/2018 | | |
| EP | 3441818 A1 | 2/2019 | | |
| JP | 2002-88158 A | 3/2002 | | |
| JP | 2002-283498 A | 10/2002 | | |
| JP | 2008-184571 A | 8/2008 | | |
| JP | 2015034961 A * | 2/2015 | ............. | G03F 7/033 |
| JP | WO2014065351 A1 * | 9/2016 | ............. | G03F 7/039 |

OTHER PUBLICATIONS

English Translation of JP WO02014/065351 A1; Shie Yamashita; Published: Sep. 8, 2016 (Year: 2016).*
English Translation of JP 2015-034961 A; Shoichi Nakamura; Published: Feb. 19, 2015 (Year: 2015).*
Extended European Search Report dated Nov. 8, 2019, issued in counterpart application No. EP 19184083.4. (7 pages).

* cited by examiner

*Primary Examiner* — Duane Smith
*Assistant Examiner* — Richard Champion
(74) *Attorney, Agent, or Firm* — Westerman, Hattori, Daniels & Adrian, LLP

(57) ABSTRACT

A white photosensitive resin composition comprising (A) an acid crosslinkable group-containing silicone resin, (B) a photoacid generator, and (C) a white pigment has a sufficient reflectivity, good reliability with respect to adhesion and crack resistance, resolution, flexibility, and light resistance.

10 Claims, No Drawings

PHOTOSENSITIVE RESIN COMPOSITION AND PATTERN FORMING PROCESS

CROSS-REFERENCE TO RELATED APPLICATION

This non-provisional application claims priority under 35 U.S.C. § 119(a) on Patent Application No. 2018-134158 filed in Japan on Jul. 17, 2018, the entire contents of which are hereby incorporated by reference.

TECHNICAL FIELD

This invention relates to a photosensitive resin composition and a pattern forming process.

BACKGROUND ART

In the prior art, photosensitive protective films for semiconductor devices and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition having flexibility. This photosensitive silicone composition is curable at low temperature and forms a coating which is fully reliable with respect to moisture resistant adhesion and other properties, but is less resistant against chemicals such as photoresist strippers having a high dissolving power, typically N-methyl-2-pyrrolidone (NMP).

To overcome the problem, Patent Document 2 proposes a photosensitive silicone composition based on a silphenylene structure-containing silicone polymer. This composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in reliability is desired.

Nowadays, many optical devices need micro-processing. For the micro-processing purpose, various resist compositions comprising a thermosetting acrylic resin and a white pigment are used to form reflectors. These resist compositions have problems including poor resolution and the lack of flexibility and adhesion in film form.

CITATION LIST

Patent Document 1: JP-A 2002-088158 (U.S. Pat. No. 6,590,010, EP 1186624)
Patent Document 2: JP-A 2008-184571 (U.S. Pat. No. 7,785,766, EP 1953183)
Patent Document 3: JP-A 2002-283498

DISCLOSURE OF INVENTION

An object of the invention is to provide a white photosensitive resin composition having a sufficient reflectivity, good reliability with respect to adhesion and crack resistance, resolution, flexibility, and light resistance, and a pattern forming process using the composition.

The inventors have found that a photosensitive resin composition comprising an acid crosslinkable group-containing silicone resin, a photoacid generator, and a white pigment is easy to form a film which is light resistant and effective for micro-processing, and has good reliability with respect to adhesion and crack resistance, resolution, and flexibility while maintaining a sufficient reflectivity.

In one aspect, the invention provides a photosensitive resin composition comprising (A) an acid crosslinkable group-containing silicone resin, (B) a photoacid generator, and (C) a white pigment.

Preferably, the acid crosslinkable group is selected from epoxy, oxetane, and vinyl ether groups.

In a preferred embodiment, component (A) contains a silicone resin comprising recurring units having the formulae (A1) to (A6).

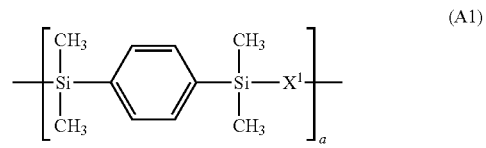

(A1)

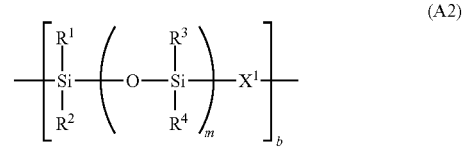

(A2)

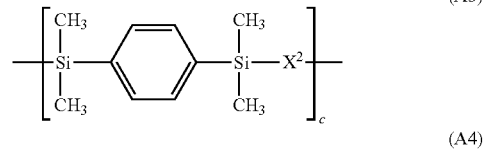

(A3)

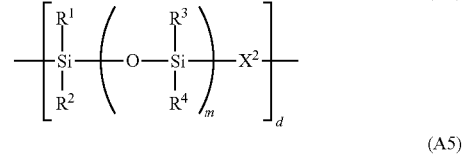

(A4)

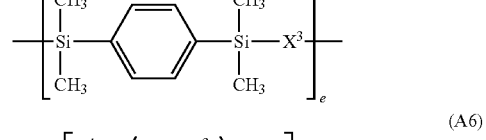

(A5)

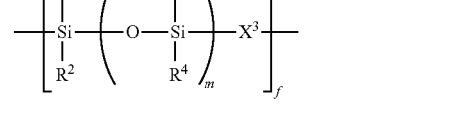

(A6)

Herein $R^1$ to $R^4$ are each independently a $C_1$-$C_{20}$ monovalent hydrocarbon group which may contain a heteroatom, m is each independently an integer of 1 to 600, groups $R^3$ may be the same or different and groups $R^4$ may be the same or different when m is an integer of at least 2, a, b, c, d, e and f are numbers in the range: $0 \leq a \leq 1$, $0 \leq b \leq 1$, $0 \leq c \leq 1$, $0 \leq d \leq 1$, $0 \leq e \leq 1$, $0 \leq f \leq 1$, $0 \leq c+d+e+f \leq 1$, and $a+b+c+d+e+f=1$.

$X^1$ is a divalent group having the formula (X1):

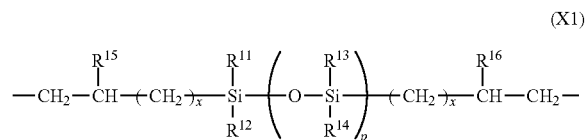

(X1)

wherein $R^{11}$ to $R^{14}$ are each independently a $C_1$-$C_{20}$ monovalent hydrocarbon group which may contain a heteroatom, p is an integer of 1 to 600, groups $R^{13}$ may be the same or different and groups $R^{14}$ may be the same or different when p is an integer of at least 2, $R^{15}$ and $R^{16}$ are each independently hydrogen or methyl, x is each independently an integer of 0 to 7.

$X^2$ is a divalent group having the formula (X2):

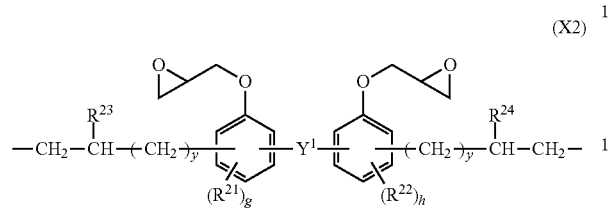

wherein $Y^1$ is a single bond, methylene, propane-2,2-diyl, 1,1,1,3,3,3-hexafluoropropane-2,2-diyl or fluorene-9,9-diyl group, $R^{21}$ and $R^{22}$ are each independently a $C_1$-$C_4$ alkyl or alkoxy group, groups $R^{21}$ may be the same or different when g is 2, groups $R^{22}$ may be the same or different when h is 2, $R^{23}$ and $R^{24}$ are each independently hydrogen or methyl, y is each independently an integer of 0 to 7, g and h are each independently 0, 1 or 2.

$X^3$ is a divalent group having the formula (X3):

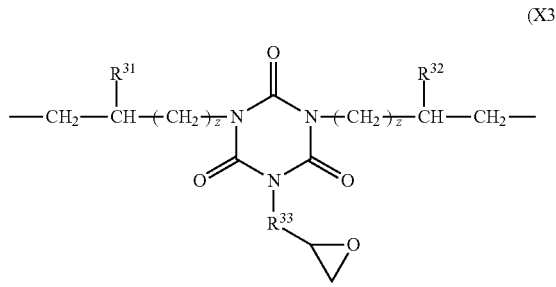

wherein $R^{31}$ and $R^{32}$ are each independently hydrogen or methyl, z is each independently an integer of 0 to 7, and $R^{33}$ is a $C_1$-$C_8$ divalent hydrocarbon group which may contain an ester bond or ether bond.

Preferably, e and f are in the range: $0<e+f\leq1$.

Preferably, the white pigment (C) has an average particle size of up to 1 μm. More preferably, the white pigment (C) is titanium dioxide which is surface treated with at least one compound selected from the group consisting of hydrous oxides of Al, Si and Zr, polyols, and organosilicon compounds. The photosensitive resin composition preferably contains 3 to 60% by weight of the white pigment (C).

The photosensitive resin composition may further comprise (D) a crosslinker, (E) an antioxidant, and/or (F) a solvent.

In another aspect, the invention provides a pattern forming process comprising the steps of (i) coating the photosensitive resin composition defined herein onto a substrate to form a photosensitive resin coating thereon, (ii) exposing the photosensitive resin coating to radiation, and (iii) developing the exposed resin coating in a developer.

Advantageous Effects of Invention

The photosensitive resin composition comprising a specific acid crosslinkable group-containing silicone resin, a photoacid generator, and a white pigment is easy to form a film. The film is light resistant and effective for microprocessing, and has good reliability with respect to adhesion and crack resistance, resolution, and flexibility. The composition is thus a useful material for forming a photosensitive resin film.

DESCRIPTION OF PREFERRED EMBODIMENT

As used herein, the notation (Cn-Cm) means a group containing from n to m carbon atoms per group. "Optional" or "optionally" means that the subsequently described event or circumstances may or may not occur, and that description includes instances where the event or circumstance occurs and instances where it does not.

Photosensitive Resin Composition

One embodiment of the invention is a photosensitive resin composition comprising (A) an acid crosslinkable group-containing silicone resin, (B) a photoacid generator, and (C) a white pigment.

(A) Silicone Resin

Component (A) is an acid crosslinkable group-containing silicone resin, i.e., a silicone resin containing a siloxane structure and an acid crosslinkable group. As used herein, the term "acid crosslinkable group" refers functional groups that form a chemical bond directly or via a crosslinker under the action of an acid. Preferably the acid crosslinkable group is an epoxy, oxetane, or vinyl ether group, with the epoxy group being most preferred.

The acid crosslinkable group-containing silicone resin as component (A) is preferably an epoxy-containing silicone resin comprising recurring units having the formulae (A1) to (A6). For simplicity sake, the recurring units having formulae (A1) to (A6) are sometimes referred to as recurring units (A1) to (A6), respectively.

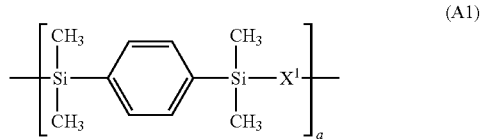

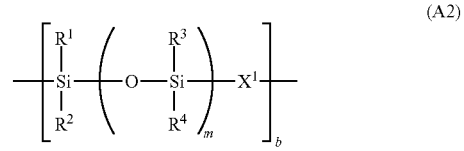

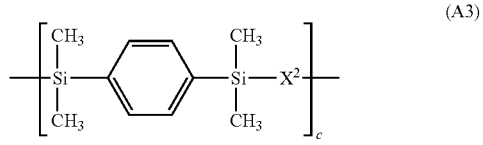

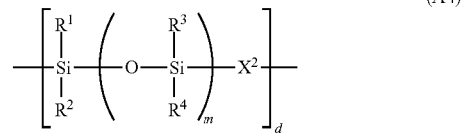

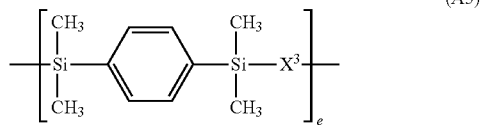

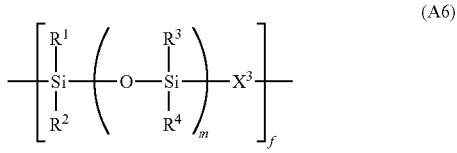

(A6)

In formulae (A2), (A4) and (A6), $R^1$ to $R^4$ are each independently a $C_1$-$C_{20}$ monovalent hydrocarbon group which may contain a heteroatom, m is each independently an integer of 1 to 600. Groups $R^3$ may be the same or different and groups $R^4$ may be the same or different when m is an integer of at least 2. In recurring units (A2), (A4) and (A6), where two or more siloxane units are included, all the siloxane units may be the same, or siloxane units of two or more different types may be included. Where siloxane units of two or more different types are included (i.e., m is an integer of at least 2), the siloxane units may be bonded randomly or alternately, or there may be included blocks each consisting of siloxane units of the same type.

The monovalent hydrocarbon groups may be straight, branched or cyclic, and include, for example, monovalent aliphatic hydrocarbon groups such as $C_1$-$C_{20}$ alkyl groups and $C_2$-$C_{20}$ alkenyl groups and monovalent aromatic hydrocarbon groups such as $C_6$-$C_{20}$ aryl groups and $C_7$-$C_{20}$ aralkyl groups.

Examples of the alkyl group include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, norbornyl, and adamantyl. Examples of the alkenyl group include vinyl, propenyl, butenyl, and pentenyl.

The monovalent aliphatic hydrocarbon group may contain a heteroatom. Specifically, some or all of the hydrogen atoms on the monovalent aliphatic hydrocarbon group may be substituted by halogen atoms such as fluorine, chlorine, bromine and iodine, or a carbonyl moiety, ether bond or thioether bond may intervene between carbon atoms. Typical of the heteroatom-bearing monovalent aliphatic hydrocarbon group is 2-oxocyclohexyl.

Examples of the aryl group include phenyl, 2-methylphenyl, 3-methylphenyl, 4-methylphenyl, 2-ethylphenyl, 3-ethylphenyl, 4-ethylphenyl, 4-tert-butylphenyl, 4-butylphenyl, dimethylphenyl, naphthyl, biphenylyl, and terphenylyl. Examples of the aralkyl group include benzyl and phenethyl.

The monovalent aromatic hydrocarbon group may contain a heteroatom.

Specifically, some or all of the hydrogen atoms on the monovalent aromatic hydrocarbon group may be substituted by $C_1$-$C_{10}$ alkoxy, $C_1$-$C_{10}$ alkylthio, $C_6$-$C_{20}$ aryloxy or $C_6$-$C_{20}$ arylthio groups.

Suitable $C_1$-$C_{10}$ alkoxy groups include methoxy, ethoxy, n-propyloxy, isopropyloxy, cyclopropyloxy, n-butyloxy, isobutyloxy, sec-butyloxy, tert-butyloxy, cyclobutyloxy, n-pentyloxy, cyclopentyloxy, n-hexyloxy, cyclohexyloxy, n-heptyloxy, n-octyloxy, n-nonyloxy, n-decyloxy, norbornyloxy, and adamantyloxy.

Suitable $C_1$-$C_{10}$ alkylthio groups include methylthio, ethylthio, n-propylthio, isopropylthio, cyclopropylthio, n-butylthio, isobutylthio, sec-butylthio, tert-butylthio, cyclobutylthio, n-pentylthio, cyclopentylthio, n-hexylthio, cyclohexylthio, n-heptylthio, n-octylthio, n-nonylthio, n-decylthio, norbornylthio, and adamantylthio.

Suitable $C_6$-$C_{20}$ aryloxy groups include phenyloxy, 2-methylphenyloxy, 3-methylphenyloxy, 4-methylphenyloxy, 2-ethylphenyloxy, 3-ethylphenyloxy, 4-ethylphenyloxy, 4-tert-butylphenyloxy, 4-butylphenyloxy, dimethylphenyloxy, naphthyloxy, biphenylyloxy, and terphenylyloxy.

Suitable $C_6$-$C_{20}$ arylthio groups include phenylthio, 2-methylphenylthio, 3-methylphenylthio, 4-methylphenylthio, 2-ethylphenylthio, 3-ethylphenylthio, 4-ethylphenylthio, 4-tert-butylphenylthio, 4-butylphenylthio, dimethylphenylthio, naphthylthio, biphenylylthio, and terphenylylthio.

Examples of the aryl group substituted with such a group include 2-methoxyphenyl, 3-methoxyphenyl, 4-methoxyphenyl, 2-ethoxyphenyl, 3-ethoxyphenyl, 4-ethoxyphenyl, 3-tert-butoxyphenyl, 4-tert-butoxyphenyl, biphenylyloxyphenyl, and biphenylylthiophenyl.

The carbon count of the monovalent aliphatic hydrocarbon group is preferably 1 to 10, more preferably 1 to 8. The carbon count of the monovalent aromatic hydrocarbon group is preferably 6 to 14, more preferably 6 to 10.

Of these, $R^1$ to $R^4$ are preferably methyl, ethyl, n-propyl or phenyl, with methyl and phenyl being more preferred.

In formulae (A2), (A4) and (A6), m is each independently an integer of 1 to 600, preferably 1 to 300, more preferably 1 to 100.

In formulae (A1) to (A6), a, b, c, d, e and f are numbers in the range: $0 \le a \le 1$, $0 \le b \le 1$, $0 \le c \le 1$, $0 \le d \le 1$, $0 \le e \le 1$, $0 \le f \le 1$, $0 \le c+d+e+f \le 1$, and $a+b+c+d+e+f=1$; preferably $0.2 \le a+c+e \le 0.95$, $0.05 \le b+d+f \le 0.8$, $0 \le a+b \le 0.9$, $0 \le c+d \le 0.7$, $0 < e+f \le 1$, and $a+b+c+d+e+f=1$; more preferably $0.3 \le a+c+e \le 0.9$, $0.1 \le b+d+f \le 0.7$, $0 \le a+b \le 0.6$, $0 \le c+d \le 0.4$, $0.4 \le e+f \le 1$, and $a+b+c+d+e+f=1$.

In formulae (A1) and (A2), $X^1$ is a divalent group having the formula (X1).

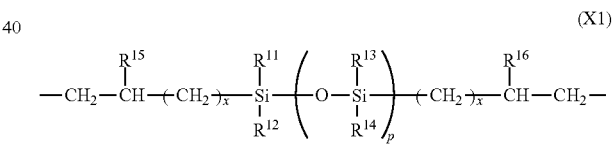

(X1)

In formula (X1), $R^{11}$ to $R^{14}$ are each independently a $C_1$-$C_{20}$ monovalent hydrocarbon group which may contain a heteroatom, and p is an integer of 1 to 600. Groups $R^{13}$ may be the same or different and groups $R^{14}$ may be the same or different when p is an integer of at least 2. $R^{15}$ and $R^{16}$ are each independently hydrogen or methyl, x is each independently an integer of 0 to 7. In the group having formula (X1), where two or more siloxane units are included, all the siloxane units may be the same or siloxane units of two or more different types may be included. Where siloxane units of two or more different types are included (i.e., p is an integer of at least 2), the siloxane units may be bonded randomly or alternately, or there may be included blocks each consisting of siloxane units of the same type.

The optionally heteroatom-containing monovalent hydrocarbon group may be straight, branched or cyclic, and examples thereof are as exemplified above in conjunction with $R^1$ to $R^4$. Among others, $R^{11}$ to $R^{14}$ are preferably methyl, ethyl, n-propyl or phenyl, with methyl and phenyl being more preferred.

In formulae (A3) and (A4), $X^2$ is a divalent group having the formula (X2).

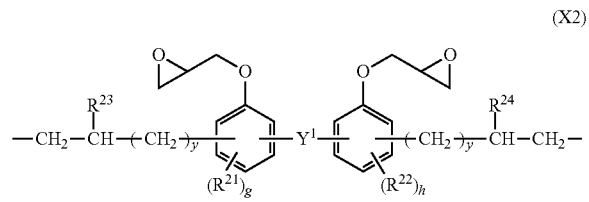

(X2)

In formula (X2), $Y^1$ is a single bond, methylene, propane-2,2-diyl, 1,1,1,3,3,3-hexafluoropropane-2,2-diyl or fluorene-9,9-diyl group. $R^{21}$ and $R^{22}$ are each independently a $C_1$-$C_4$ alkyl or alkoxy group. Groups $R^{21}$ may be the same or different when g is 2. Groups $R^{22}$ may be the same or different when h is 2. $R^{23}$ and $R^{24}$ are each independently hydrogen or methyl, y is each independently an integer of 0 to 7, g and h are each independently 0, 1 or 2.

In formulae (A5) and (A6), $X^3$ is a divalent group having the formula (X3).

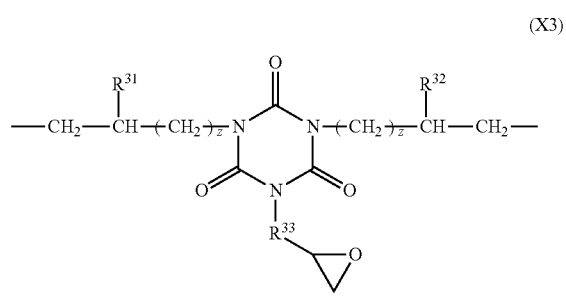

(X3)

In formula (X3), $R^{31}$ and $R^{32}$ are each independently hydrogen or methyl, and z is each independently an integer of 0 to 7.

In formula (X3), $R^{33}$ is a $C_1$-$C_8$ divalent hydrocarbon group which may contain an ester bond or ether bond. The divalent hydrocarbon group may be straight, branched or cyclic, and examples thereof include alkanediyl groups such as methylene, ethylene, propane-1,2-diyl, propane-1,3-diyl, butane-1,2-diyl, butane-1,3-diyl, and butane-1,4-diyl. An ester bond or ether bond may intervene between carbon atoms in the divalent hydrocarbon group. Among others, $R^{33}$ is preferably methylene or ethylene, with methylene being more preferred.

The recurring units (A1) to (A6) may be bonded randomly or blockwise. The acid crosslinkable group-containing silicone resin preferably has a silicone (siloxane units) content of 30 to 80% by weight.

The silicone resin preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran as the elute.

The acid crosslinkable group-containing silicone resin as component (A) may be prepared, for example, by mixing necessary amounts of a vinyl-containing compound and a hydrosilyl-containing compound corresponding to portions of the silicone resin, and effecting hydrosilylation reaction in a conventional manner.

The acid crosslinkable group-containing silicone resin as component (A) may be used alone or in admixture of two or more.

(B) Photoacid Generator

The photoacid generator (PAG) as component (B) is typically a compound which is decomposed to generate an acid upon light exposure, preferably upon exposure to light with a wavelength of 190 to 500 nm. The generated acid serves as a curing catalyst. Typical PAGs include onium salts, diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, imino sulfonate derivatives, and triazine derivatives.

Suitable onium salts include sulfonium salts having the formula (B1) and iodonium salts having the formula (B2).

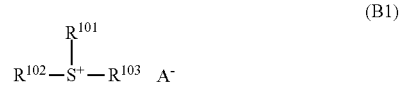

(B1)

(B2)

In formulae (B1) and (B2), $R^{101}$ to $R^{105}$ are each independently an optionally substituted $C_1$-$C_{12}$ alkyl group, optionally substituted $C_6$-$C_{12}$ aryl group, or optionally substituted $C_7$-$C_{12}$ aralkyl group. $A^-$ is a non-nucleophilic counter ion.

The alkyl group may be straight, branched or cyclic, and examples thereof include methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl, and adamantyl. Suitable aryl groups include phenyl, naphthyl, and biphenylyl. Suitable aralkyl groups include benzyl and phenethyl.

Suitable substituents include oxo, $C_1$-$C_{12}$ straight, branched or cyclic alkoxy moieties, $C_1$-$C_{12}$ straight, branched or cyclic alkyl moieties, $C_6$-$C_{24}$ aryl moieties, $C_7$-$C_{25}$ aralkyl moieties, $C_6$-$C_{24}$ aryloxy moieties, and $C_6$-$C_{24}$ arylthio moieties.

Preferably, $R^{101}$ to $R^{105}$ are optionally substituted alkyl groups such as methyl, ethyl, propyl, butyl, cyclohexyl, norbornyl, adamantyl, and 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyloxyphenyl, and biphenylylthiophenyl; and optionally substituted aralkyl groups such as benzyl and phenethyl. Of these, optionally substituted aryl groups and optionally substituted aralkyl groups are more preferred.

Examples of the non-nucleophilic counter ion include halide ions such as chloride and bromide ions; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Suitable diazomethane derivatives include compounds having the formula (B3).

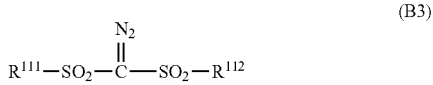

In formula (B3), $R^{111}$ and $R^{112}$ are each independently a $C_1$-$C_{12}$ alkyl or haloalkyl group, optionally substituted $C_6$-$C_{12}$ aryl group, or $C_7$-$C_{12}$ aralkyl group.

The alkyl group may be straight, branched or cyclic, and examples thereof are as exemplified above in conjunction with $R^{101}$ to $R^{105}$. Suitable haloalkyl groups include trifluoromethyl, 1,1,1-trifluoroethyl, 1,1,1-trichloroethyl, and nonafluorobutyl.

Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Suitable aralkyl groups include benzyl and phenethyl.

Suitable glyoxime derivatives include compounds having the formula (B4).

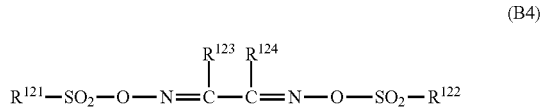

In formula (B4), $R^{121}$ to $R^{124}$ are each independently a $C_1$-$C_{12}$ alkyl or haloalkyl group, optionally substituted $C_6$-$C_{12}$ aryl group, or $C_7$-$C_{12}$ aralkyl group. $R^{123}$ and $R^{124}$ may bond together to form a ring with the carbon atoms to which they are attached. In the case of ring formation, the combination of $R^{123}$ and $R^{124}$ is a straight or branched $C_1$-$C_{12}$ alkylene group.

Examples of the alkyl, haloalkyl, optionally substituted aryl, and aralkyl groups are as exemplified above in conjunction with $R^{111}$ to $R^{112}$. Suitable straight or branched alkylene groups include methylene, ethylene, propylene, butylene, and hexylene.

Examples of the onium salt include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, to diphenyl(4-thiophenoxyphenyl)sulfonium hexafluoroantimonate, [4-(4-biphenylylthio)phenyl]-4-biphenylylphenylsulfonium tris(trifluoromethanesulfonyl)-methide, triphenylsulfonium tetrakis(fluorophenyl)borate, tris[4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis(pentafluorophenyl)borate.

Examples of the diazomethane derivative include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-pentylsulfonyl)diazomethane, bis(isopentylsulfonyl)diazomethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Examples of the glyoxime derivative include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Examples of the β-ketosulfone derivative include 2-cyclohexylcarbonyl-2-(p-toluenesulfonyl)propane and 2-isopropylcarbonyl-2-(p-toluenesulfonyl)propane.

Examples of the disulfone derivative include diphenyl disulfone and dicyclohexyl disulfone.

Examples of the nitrobenzyl sulfonate derivative include 2,6-dinitrobenzyl p-toluenesulfonate and 2,4-dinitrobenzyl p-toluenesulfonate.

Examples of the sulfonic acid ester derivative include 1,2,3-tris(methanesulfonyloxy)benzene, 1,2,3-tris(trifluoromethanesulfonyloxy)benzene, and 1,2,3-tris(p-toluenesulfonyloxy)benzene.

Examples of the imidyl sulfonate derivative include phthalimidyl triflate, phthalimidyl tosylate, 5-norbornene-2,3-dicarboximidyl triflate, 5-norbornene-2,3-dicarboximidyl tosylate, 5-norbornene-2,3-dicarboximidyl n-butylsulfonate, and n-trifluoromethylsulfonyloxynaphthylimide.

Typical of the oximesulfonate derivative is α-(benzenesulfonium oxyimino)-4-methylphenylacetonitrile.

Examples of the iminosulfonate derivative include (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino-5H-thiophen-2-ylidene)-(2-methylphenyl)acetonitrile.

Also useful is 2-methyl-2-1[(4-methylphenyl)sulfonyl]-1-[(4-methylthio)phenyl]-1-propane.

The preferred PAGs as component (B) are the onium salts, with the sulfonium salts being more preferred.

The PAG (B) is preferably used in an amount of 0.05 to 20 parts by weight, and more preferably 0.2 to 5 parts by weight per 100 parts by weight of component (A). An amount of the PAG in the range maintains the composition fully photo-curable and avoids the risk that the light absorption by the PAG itself adversely affects curing of a thick film. To obtain the characteristics of the invention, transparency and light resistance, it is recommended that the amount of the light absorbing PAG added be reduced as long as the photo-cure behavior is not retarded. The PAGs may be used alone or in admixture of two or more.

(C) White Pigment

Component (C) is a white pigment which is added not only to increase the whiteness of a cured product, but also to increase the resolution of a pattern forming material and to improve the breakage properties of a cured product or resist film (or to prevent cracking), forming a non-peelable film.

Examples of the white pigment include titanium dioxide, rare earth oxides such as yttrium oxide, zinc sulfate, zinc oxide, and magnesium oxide. While the shape of the white pigment is not particularly limited, any of well-known white pigments may be used. From the standpoint of fine-size pattern formation or micro-patterning, the white pigment preferably has an average particle size of up to 1 µm, more preferably up to 0.5 µm. As the lower limit, the white pigment preferably has an average particle size of at least 10 nm. As used herein, the average particle size is a volume average particle size as measured by the dynamic light scattering method.

It is preferred from the standpoint of whiteness that the white pigment be titanium dioxide. Although both titanium dioxide products prepared by the sulfate and chloride methods are acceptable, the chloride product is preferable from the standpoint of whiteness.

Preference is given to the titanium dioxide which has been surface treated for the purpose of preventing titanium oxide particles from agglomerating. More preferably, titanium dioxide is surface treated with any of hydrous oxides of Al, Si and Zr, polyols, and organosilicon compounds in order to suppress the photocatalytic activity of titanium dioxide and to render titanium dioxide particles more compatible with or dispersible in the resin and inorganic filler.

Suitable organosilicon compounds for surface treatment include silane coupling agents, for example, polysiloxanes such as polydimethylsiloxane, polymethylphenylsiloxane, polymethylhydrogensiloxane, and copolymers thereof; cyclosiloxanes such as hexamethylcyclotrisiloxane, heptamethylcyclotetrasiloxane, 1,3,5,7-tetramethylcyclotetrasiloxane; chlorosilanes such as trimethylchlorosilane, dimethyldichlorosilane, and methyltrichlorosilane; silanes having epoxy functionality such as 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane; silanes having a methacrylic or acrylic group such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane; silanes having a vinyl group such as vinyltrichlorosilane, vinyltrimethoxysilane, vinyltriethoxysilane, vinyltris(β-methoxyethoxy)silane, and vinyltriacetoxysilane; mercaptosilanes such as γ-mercaptopropyltrimethoxysilane and γ-mercaptopropylmethyldimethoxysilane; silanes having an alkyl group such as methyltrimethoxysilane, methyltriethoxysilane, hexyltrimethoxysilane, hexyltriethoxysilane, octyltrimethoxysilane, and octyltriethoxysilane; other silanes such as γ-chloropropyltrimethoxysilane and γ-anilinopropyltrimethoxysilane; and partial hydrolyzates of one or more of the foregoing silanes. Also useful are hexamethyldisiloxane and hexamethyldisilazane. Of these, the polysiloxanes are preferred, with polydimethylsiloxane being more preferred.

The method for the surface treatment of a white pigment is not particularly limited. For example, the surface treatment with an organosilicon compound may be performed by a dry method of mixing the pigment with the organosilicon compound. The surface treatment with alumina or silica may be performed by a wet method of immersing the pigment in an aqueous solution of sodium aluminate or sodium silicate while neutralizing with sulfuric acid, for thereby forming a surface layer on the pigment.

The white pigment (C) is preferably blended in an amount of 3 to 60% by weight, more preferably 5 to 50% by weight based on the composition. An amount of at least 3% by weight avoids any loss of whiteness whereas an amount of up to 60% by weight avoids the risk that the composition is less flowable and inefficient to mold, causing unloading or voids. The white pigments may be used alone or in admixture of two or more.

(D) Crosslinker

The photosensitive resin composition may further comprise (D) a crosslinker. The crosslinker reacts with epoxy groups on component (C) and functions to facilitate pattern formation and to increase the strength of the photo-cured resin film.

Preferably, the crosslinker is selected from compounds having on the average at least two epoxy groups, alicyclic epoxy groups or oxetane groups in the molecule. Of these compounds, low and high molecular weight compounds having a weight average molecular weight (Mw) of 100 to 20,000, especially 200 to 10,000 are preferred. A compound with a Mw of at least 100 may render the composition fully photo-curable whereas a compound with a Mw of up to 20,000 may not adversely affect the heat resistance of the photo-cured composition.

The crosslinker (D) may be blended in an amount of 0 to 100 parts, and when used, in an amount of preferably 0.5 to 100 parts, more preferably 1 to 50 parts by weight per 100 parts by weight of component (A). At least 0.5 part of component (D) ensures sufficient cure upon light exposure. As long as the amount of component (D) is up to 100 parts, the proportion of component (C) in the resin composition is not reduced, allowing the cured composition to exert its effects to the full extent. The crosslinkers may be used alone or in admixture.

(E) Antioxidant

The photosensitive resin composition may further contain (E) an antioxidant as an additive which is effective for improving heat resistance. The antioxidant is typically selected from hindered phenol compounds and hindered amine compounds.

Although the hindered phenol compounds used herein are not particularly limited, the hindered phenol compounds listed below are preferred. 1,3,5-trimethyl-2,4,6-tris(3,5-di-t-butyl-4-hydroxybenzyl)benzene (trade name: IRGANOX 1330), 2,6-di-t-butyl-4-methylphenol (trade name: Sumilizer BHT), 2,5-di-t-butylhydroquinone (trade name: Nocrac NS-7), 2,6-di-t-butyl-4-ethylphenol (trade name: Nocrac M-17), 2,5-di-t-pentylhydroquinone (trade name: Nocrac DAH), 2,2'-methylenebis(4-methyl-6-t-butylphenol) (trade name: Nocrac NS-6), 3,5-di-t-butyl-4-hydroxybenzyl phosphonate diethyl ester (trade name: IRGANOX 1222), 4,4'-thiobis(3-methyl-6-t-butylphenol) (trade name: Nocrac 300), 2,2'-methylenebis(4-ethyl-6-t-butylphenol) (trade name: Nocrac NS-5), 4,4'-butylidenebis(3-methyl-6-t-butylphenol) (trade name: Adeka Stab AO-40), 2-t-butyl-6-(3-t-butyl-2-hydroxy-5-methylbenzyl)-4-methylphenyl acrylate (trade name: Sumilizer GM), 2-[1-(2-hydroxy-3,5-di-t-pentylphenyl)ethyl]-4,6-di-t-pentylphenyl acrylate (trade name: Sumilizer GS), 2,2'-methylenebis[4-methyl-6-(α-methylcyclohexyl)phenol], 4,4'-methylenebis(2,6-di-t-butylphenol) (trade name: Seenox 226M), 4,6-bis(octylthiomethyl)-o-cresol (trade name: IRGANOX 1520L), 2,2'-ethylenebis(4,6-di-t-butylphenol), octadecyl 3-(3,5-di-t-butyl-4-hydroxyphenyl)propionate (trade name: IRGANOX 1076), 1,1,3-tris(2-methyl-4-hydroxy-5-t-butylphenyl)butane (trade name: Adeka Stab AO-30), tetrakis[methylene-(3,5-di-t-butyl-4-hydroxyhydrocinnamate)]methane (trade name: Adeka Stab AO-60), triethylene glycol bis[3-(3-t-butyl-5-methyl-4-hydroxyphenyl)propionate] (trade name: IRGANOX 245), 2,4-bis(n-octylthio)-6-(4-hydroxy-3,5-di-t-butylanilino)-1,3,5-triazine (trade name: IRGANOX 565), N,N'-hexamethylenebis(3,5-di-t-butyl-4-hydroxyhydrocinnamide) (trade name: IRGANOX 1098), 1,6-hexanediol-bis[3-(3,5-di-t-butyl-4-hydroxyphenyl)propionate] (trade name: IRGANOX 259), 2,2-thio-diethylenebis[3-(3,5-di-t-butyl-4-hydroxyphenyl)-propionate] (trade name: IRGANOX 1035), 3,9-bis[2-[3-(3-t-butyl-4-hydroxy-5-methylphenyl)propionyloxy]-1,1-dimethylethyl] 2,4,8,10-tetraoxaspiro[5.5]undecane (trade name: Sumilizer GA-80), tris(3,5-di-t-butyl-4-hydroxybenzyl) isocyanurate (trade name: IRGANOX 3114), bis(ethyl 3,5-di-t-butyl-4-hydroxybenzylphosphonate) calcium/polyethylene wax 50/50 mixture (trade name: IRGANOX 1425WL), isooctyl 3-(3,5-di-t-butyl-4-hydroxyphenyl)propionate (trade name: IRGANOX 1135), 4,4'-thiobis(6-t-butyl-3-methylphenol) (trade name: Sumilizer WX-R), 6-[3-(3-t-butyl-4-hydroxy-5-methylphenyl)propoxy]-2,4,8,10-tetra-t-butyldibenzo[d,f][1,3,2]dioxaphosphepin (trade name: Sumilizer GP), etc.

Although the hindered amine compounds used herein are not particularly limited, the hindered amine compounds listed below are preferred. p,p'-dioctyldiphenylamine (trade name: IRGANOX 5057), phenyl-α-naphthylamine (trade name: Nocrac PA), poly(2,2,4-trimethyl-1,2-dihydroquinoline) (trade name: Nocrac 224, 224-S), 6-ethoxy-2,2,4-trimethyl-1,2-dihydroquinoline (trade name: Nocrac AW), N,N'-diphenyl-p-phenylenediamine (trade name: Nocrac DP), N,N'-di-β-naphthyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'-(α,α-dimethylbenzyl) diphenylamine (trade name: Nocrac CD), p,p-toluenesulfonyl-aminodiphenylamine (trade name: Nocrac TD), N-phenyl-N'-(3-methacryloxy-2-hydroxypropyl)-p-phenylenediamine (trade name: Nocrac G1), N-(1-methylheptyl)-N'-phenyl-p-phenylenediamine (trade name: Ozonon 35), N,N'-di-sec-butyl-p-phenylene-diamine (trade name: Sumilizer BPA), N-phenyl-N'-1,3-dimethylbutyl-p-phenylene-diamine (trade name: Antigene 6C), alkylated diphenylamine (trade name: Sumilizer 9A), dimethyl-1-(2-hydroxyethyl)-4-hydroxy-2,2,6,6-tetramethylpiperidine succinate polycondensate (trade name: Tinuvin 622LD), poly[[6-(1,1,3,3-tetramethylbutypamino]-1,3,5-triazine-2,4-diyl][(2,2,6,6-tetramethyl-4-piperidypimino]hexamethylene [(2,2,6,6-tetramethyl-4-piperidyl)imino]] (trade name: CHIMASSORB 944), N,N'-bis(3-amino-propyl) ethylenediamine-2,4-bis[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl)sebacate (trade name: Tinuvin 123), bis(2,2,6,6-tetramethyl-4-piperidyl)sebacate (trade name: Tinuvin 770), bis(1,2,2,6,6-pentamethyl-4-piperidyl) 2-(3,5-di-t-butyl-4-hydroxybenzyl)-2-n-butylmalonate (trade name: Tinuvin 144), bis(1,2,2,6,6-pentamethyl-4-piperidyl)sebacate (trade name: Tinuvin 765), tetrakis(1,2,2,6,6-pentamethyl-4-piperidyl) 1,2,3,4-butanetetracarboxylate (trade name: LA-57), tetrakis(2,2,6,6-tetramethyl-4-piperidyl) 1,2,3,4-butanetetracarboxylate (trade name: LA-52), an esterified mixture of 1,2,3,4-butanetetracarboxylic acid with 1,2,2,6,6-pentamethyl-4-piperidinol and 1-tridecanol (trade name: LA-62), an esterified mixture of 1,2,3,4-butanetetracarboxylic acid with 2,2,6,6-tetramethyl-4-piperidinol and 1-tridecanol (trade name: LA-67), an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD), (2,2,6,6-tetramethylene-4-piperidyl)-2-propylene carboxylate (trade name: Adeka Stab LA-82), (1,2,2,6,6-pentamethyl-4-piperidyl)-2-propylene carboxylate (trade name: Adeka Stab LA-87), etc.

The amount of component (E) used is not particularly limited as long as the benefits of the invention are not impaired. When used, the amount of component (E) is preferably 0.01 to 1% by weight of the resin composition. The antioxidants may be used alone or in admixture.

(F) Solvent

To the photosensitive resin composition, (F) a solvent may be added in order to facilitate the coating operation. The solvent (F) used herein is not particularly limited as long as components (A) to (E) and other additives are dissolvable or dispersible therein.

Preferred solvents are organic solvents. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more.

Of these solvents, preferred are ethyl lactate, cyclohexanone, cyclopentanone, PGMEA, γ-butyrolactone, and mixtures thereof, in which the PAG is most soluble.

It is preferred from the standpoints of compatibility and viscosity of the resin composition that the solvent (F) be used in an amount of 50 to 2,000 parts, more preferably 50 to 1,000 parts, and especially 50 to 100 parts by weight per 100 parts by weight of components (A) and (C) combined.

Other Additives

Besides the aforementioned components, the photosensitive resin composition may contain other additives, for example, surfactants which are commonly used for improving coating properties, silane coupling agents, and fillers.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. The amount of surfactant is not particularly limited as long as the benefits of the invention are not impaired. When used, the amount of the surfactant is preferably 0.01 to 1% by weight of the resin composition.

Inclusion of a silane coupling agent is effective for enhancing the adhesion of the resin composition to adherends. Suitable silane coupling agents include epoxy silane coupling agents and aromatic aminosilane coupling agents. The silane coupling agent may be used alone or in admixture. The amount of the silane coupling agent used is not particularly limited as long as the benefits of the invention are not impaired. When used, the amount of the silane coupling agent is preferably 0.01 to 5% by weight of the resin composition.

A filler may also be blended in the resin composition as the other additive. The filler is typically silica or silicone powder having an average particle size of 0.01 to 20 µm. The amount of the filler is preferably up to 90% by weight of the resin composition, though not limited thereto.

Pattern Forming Process

Another embodiment of the invention is a pattern forming process using the photosensitive resin composition defined above, the process comprising the steps of:

(i) coating the photosensitive resin composition onto a substrate to form a photosensitive resin coating thereon, (ii) exposing the photosensitive resin coating to radiation to define exposed and unexposed regions, and (iii) developing the exposed resin coating in a developer to dissolve away the unexposed region of the resin coating and to form a pattern of the resin coating.

First, in step (i), the photosensitive resin composition is coated onto a substrate to form a photosensitive resin coating thereon. Examples of the substrate include silicon wafers, glass wafers, quartz wafers, plastic circuit boards, and ceramic circuit boards.

The coating technique may be any well-known technique, for example, dipping, spin coating, roll coating or the like. The coating weight may be selected as appropriate for a particular purpose, preferably so as to form a photosensitive resin coating having a thickness of 0.1 to 200 µm, more preferably 1 to 150 µm.

A pre-wetting technique of dispensing a solvent dropwise on a substrate prior to coating of the resin composition may be employed for the purpose of making the coating thickness on the substrate more uniform. The type and amount of the solvent dispensed dropwise may be selected for a particular purpose. For example, alcohols such as isopropyl alcohol (IPA), ketones such as cyclohexanone, and glycols such as propylene glycol monomethyl ether are preferred. The solvent used in the photosensitive resin composition may also be used.

At this point, the coating may be prebaked to volatilize off the solvent and the like, if necessary, for efficient photo-cure reaction. Prebake may be performed, for example, at 40 to 140° C. for 1 minute to about 1 hour.

Next, in step (ii), the photosensitive resin coating is exposed to radiation to define exposed and unexposed regions. The exposure radiation is preferably of wavelength 10 to 600 nm, more preferably 190 to 500 nm. Examples of radiation in the wavelength range include radiation of various wavelengths from radiation-emitting units, specifically UV radiation such as g-line, h-line or i-line, and deep UV (248 nm, 193 nm). Among these, radiation of wavelength 248 to 436 nm is preferred. An appropriate exposure dose is 10 to 10,000 mJ/cm$^2$.

Exposure may be made through a photomask. The photomask may be, for example, one perforated with a desired pattern. Although the material of the photomask is not particularly limited, a material capable of shielding radiation in the above wavelength range, typically chromium is preferred.

The next step may be post-exposure bake (PEB) which is effective for enhancing development sensitivity. PEB is preferably performed at 40 to 150° C. for 0.5 to 10 minutes. The exposed region of the resin coating is crosslinked during PEB to form an insolubilized to pattern which is insoluble in an organic solvent as developer.

The exposure or PEB is followed by the step (iii) of developing the exposed resin coating in a developer to dissolve away the unexposed region of the resin coating and to form a pattern of the resin coating. The preferred developers are organic solvents including alcohols such as IPA, ketones such as cyclohexanone, and glycols such as propylene glycol monomethyl ether. The solvent used in the photosensitive resin composition is also useful. Development is effected in a conventional manner, for example, by dipping the exposed coating in the developer. The development is followed by washing, rinsing and drying if necessary. In this way, a resin coating having the desired pattern is obtained.

In step (iv), the patterned coating may be post-cured in an oven or hot plate at a temperature of preferably 100 to 250° C., more preferably 150 to 220° C. The photosensitive resin composition ensures that a resin coating having improved film properties is obtained from post-cure even at a relatively low temperature around 200° C. The post-cure is effective for increasing the crosslinking density of the resin coating and removing any residual volatile matter. The resulting coating has augmented adhesion to substrates, heat resistance, mechanical strength, good electric properties, and bond strength. A post-cure temperature in the range of 100 to 250° C. is preferred for acquiring the above properties. The post-cure time is preferably 10 minutes to 10 hours, more preferably 10 minutes to 3 hours. The resin coating as post-cured has a thickness of 1 to 200 µm, preferably 5 to 50 µm. Through the foregoing steps, a cured film suited for the final reflector application is obtained.

Photosensitive Dry Film

A further embodiment of the invention is a photosensitive dry film comprising a support and a photosensitive resin coating of the photosensitive resin composition thereon.

The photosensitive dry film (support+photosensitive resin coating) is solid, and the photosensitive resin coating contains no solvent. This eliminates the risk that bubbles resulting from volatilization of solvent are left within the resin coating and between the resin coating and the rugged substrate surface. The photosensitive resin coating preferably has a thickness of 1 to 200 μm, more preferably 3 to 100 μm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive dry film has the advantage that when tightly attached to a substrate having asperities on its surface, the photosensitive resin coating is coated so as to conform to the asperities, achieving high planarity. Since the photosensitive resin composition is characterized by softening performance, high planarity is positively achievable. Further, if the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support (film) is unwound from a supply roll in the film coater, passed across the head of the film coater where the photosensitive resin composition is coated onto the support to the predetermined buildup, and then moved through a hot air circulating oven at a predetermined temperature for a predetermined time, where the photosensitive resin coating is dried on the support. Thereafter, the support having the photosensitive resin coating thereon and a protective film which is unwound from another supply roll in the film coater are passed across a laminate roll under a predetermined pressure whereby the protective film is bonded to the photosensitive resin coating on the support, whereupon the laminate (protective film-bearing photosensitive dry film) is wound up on a take-up shaft in the film coater. Preferably, the oven temperature is 25 to 150° C., the pass time is 1 to 100 minutes, and the bonding pressure is 0.01 to 5 MPa.

The support film used in the photosensitive dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38×1-A3, PET38×1-V8 and PET38×1-X08 from Nippa Co., Ltd.

The protective film used in the photosensitive dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 μm, more preferably 25 to 50 μm, for consistent manufacture of photosensitive dry film, and prevention of wrapping or curling on a take-up roll.

Pattern Forming Process Using Photosensitive Dry Film

A further embodiment of the invention is a pattern forming process comprising the steps of:

(i') using the photosensitive dry film to form the photosensitive resin coating on a substrate, (ii) exposing the photosensitive resin coating to radiation to define exposed and unexposed regions, (iii) developing the exposed resin coating in a developer to dissolve away the unexposed region of the resin coating and to form a pattern of the resin coating.

In step (i'), the photosensitive dry film is used to form the photosensitive resin coating on a substrate. Specifically, the photosensitive dry film at its photosensitive resin coating is attached to a substrate to form the photosensitive resin coating on the substrate. When the photosensitive dry film is covered with the protective film, the dry film at its photosensitive resin coating is attached to a substrate after stripping the protective film therefrom, to form the photosensitive resin coating on the substrate. The dry film may be attached using a film attachment apparatus.

The film attachment apparatus is preferably a vacuum laminator. The photosensitive dry film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour.

Like the pattern forming process using the photosensitive resin composition, the photosensitive resin coating attached to the substrate may be subjected to steps of (ii) exposing the photosensitive resin coating to radiation, (iii) developing the exposed resin coating in a developer to dissolve away the unexposed region of the resin coating and to form a pattern of the resin coating, and optionally (iv) post-curing the patterned coating. It is noted that the support of the photosensitive dry film may be removed before prebake or before PEB, by mechanical stripping or the like, depending on a particular process.

The pattern forming process using the photosensitive resin composition or photosensitive dry film facilitates to form a fine size pattern of thick film.

The film formed from the photosensitive resin composition is best suited as a reflector in a photo-semiconductor device having LED mounted thereon.

EXAMPLES

Examples of the invention are given below by way of illustration and not by way of limitation. Notably, the weight average molecular weight (Mw) is measured by gel permeation chromatography (GPC) versus monodisperse polystyrene standards using GPC column TSKgel Super HZM-H (Tosoh Corp.) under analytical conditions: flow rate 0.6 mL/min, tetrahydrofuran elute, and column temperature 40° C. All parts are by weight (pbw).

Compounds (S-1) to (S-5) used in Examples are shown below.

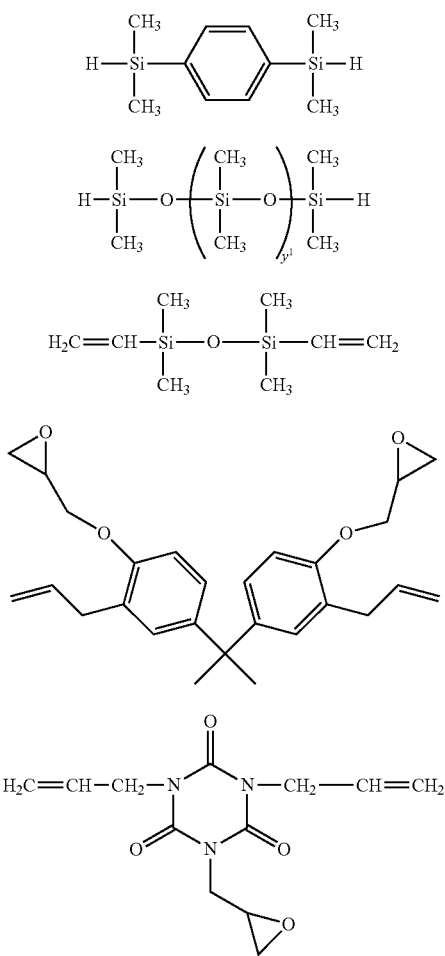

Notably, Compound (S-2) is available from Shin-Etsu Chemical Co., Ltd.

[1] Synthesis of Acid Crosslinkable Group-Containing Silicone Resins

Synthesis Example 1

Synthesis of Resin A-1

A 3-L flask equipped with a stirrer, thermometer, nitrogen purge line and reflux condenser was charged with 265.0 g (1.00 mol) of Compound (S-5), then with 2,000 g of toluene and heated at 70° C. Thereafter, 1.0 g of a toluene solution of chloroplatinic acid (platinum concentration 0.5 wt %) was added, and 164.9 g (0.85 mol) of Compound (S-1) and 453.0 g (0.15 mol) of Compound (S-2) ($y^1$=40) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin A-1. On analysis by $^1$H-NMR and $^{29}$Si-NMR spectroscopy (Bruker Corp.) and GPC, the structure of Resin A-1 was identified. Resin A-1 had a Mw of 65,000 and a silicone content of 51.3 wt %.

Synthesis Example 2

Synthesis of Resin A-2

A 3-L flask equipped with a stirrer, thermometer, nitrogen purge line and reflux condenser was charged with 111.6 g (0.60 mol) of Compound (S-3) and 156.8 g (0.40 mol) of Compound (S-4), then with 2,000 g of toluene and heated at 70° C. Thereafter, 1.0 g of a toluene solution of chloroplatinic acid (platinum concentration 0.5 wt %) was added, and 135.8 g (0.70 mol) of Compound (S-1) and 906.0 g (0.30 mol) of Compound (S-2) ($y^1$=40) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin A-2. On analysis by $^1$H-NMR and $^{29}$Si-NMR spectroscopy (Bruker Corp.) and GPC, the structure of Resin A-2 was identified. Resin A-2 had a Mw of 55,000 and a silicone content of 77.7 wt %.

Synthesis Example 3

Synthesis of Resin A-3

A 3-L flask equipped with a stirrer, thermometer, nitrogen purge line and reflux condenser was charged with 111.6 g (0.60 mol) of Compound (S-3) and 106.0 g (0.40 mol) of Compound (S-5), then with 2,000 g of toluene and heated at 70° C. Thereafter, 1.0 g of a toluene solution of chloroplatinic acid (platinum concentration 0.5 wt %) was added, and 174.6 g (0.90 mol) of Compound (S-1) and 302.0 g (0.10 mol) of Compound (S-2) ($y^1$=40) were added dropwise over 1 hour. The ratio of the total moles of hydrosilyl groups to the total moles of alkenyl groups was 1/1. At the end of dropwise addition, the reaction to solution was heated at 100° C. and aged for 6 hours. Toluene was distilled off in vacuum from the reaction solution, yielding Resin A-3. On analysis by $^1$H-NMR and $^{29}$Si-NMR spectroscopy (Bruker Corp.) and GPC, the structure of Resin A-3 was identified. Resin A-3 had a Mw of 50,000 and a silicone content of 59.6 wt %.

Synthesis Example 4

Synthesis of Resin A-4

A 3-L flask equipped with a stirrer, thermometer, nitrogen purge line and reflux condenser was charged with 392.0 g (1.00 mol) of Compound (S-4), then with 2,000 g of toluene and heated at 70° C. Thereafter, 1.0 g of a toluene solution of chloroplatinic acid (platinum concentration 0.5 wt %) was added, and 155.2 g (0.80 mol) of Compound (S-1) and 317.0 g (0.20 mol) of Compound (S-2) ($y^1$=20) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin A-4. On analysis by $^1$H-NMR and $^{29}$Si-NMR spectroscopy (Bruker Corp.) and GPC, the structure of Resin A-4 was identified. Resin A-4 had a Mw of 23,000 and a silicone content of 36.7 wt %.

Synthesis Example 5

Synthesis of Resin A-5

A 3-L flask equipped with a stirrer, thermometer, nitrogen purge line and reflux condenser was charged with 274.4 g (0.70 mol) of Compound (S-4) and 79.5 g (0.30 mol) of Compound (S-5), then with 2,000 g of toluene and heated at 70° C. Thereafter, 1.0 g of a toluene solution of chloroplatinic acid (platinum concentration 0.5 wt %) was added, and 58.2 g (0.30 mol) of Compound (S-1) and 1109.5 g (0.70 mol) of Compound (S-2) ($y^1=20$) were added dropwise over 1 hour. The ratio of the total moles of hydrosilyl groups to the total moles of alkenyl groups was 1/1. At the end of dropwise addition, the reaction to solution was heated at 100° C. and aged for 6 hours. Toluene was distilled off in vacuum from the reaction solution, yielding Resin A-5. On analysis by $^1$H-NMR and $^{29}$Si-NMR spectroscopy (Bruker Corp.) and GPC, the structure of Resin A-5 was identified. Resin A-5 had a Mw of 42,000 and a silicone content of 72.9 wt %.

Synthesis Example 6

Synthesis of Resin A-6

A 3-L flask equipped with a stirrer, thermometer, nitrogen purge line and reflux condenser was charged with 55.8 g (0.30 mol) of Compound (S-3), 117.6 g (0.30 mol) of Compound (S-4), and 106.0 g (0.40 mol) of Compound (S-5), then with 2,000 g of toluene and heated at 70° C. Thereafter, 1.0 g of a toluene solution of chloroplatinic acid (platinum concentration 0.5 wt %) was added, and 135.8 g (0.70 mol) of Compound (S-1) and 475.5 g (0.30 mol) of Compound (S-2) ($y^1=20$) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin A-6. On analysis by $^1$H-NMR and $^{29}$Si-NMR spectroscopy (Bruker Corp.) and GPC, the structure of Resin A-6 was identified. Resin A-6 had a Mw of 31,000 and a silicone content of 59.6 wt %.

Comparative Synthesis Example 1

Synthesis of Acrylic Resin 1

A flask equipped with a stirrer, thermometer, inert gas supply line and reflux condenser was charged with 70 g of propylene glycol monomethyl ether and 70 g of toluene and heated at 80° C. under nitrogen gas atmosphere. While the flask was maintained at a temperature of 80±2° C., 90 g of methyl methacrylate, 10 g of methacrylic acid, and 2,2'-azobis(isobutyronitrile) were constantly added dropwise over 4 hours. At the end of dropwise addition, stirring was continued at 80±2° C. for 6 hours, yielding a solution of Acrylic Resin 1. Acrylic Resin 1 had a Mw of 50,000.

[2] Preparation and Evaluation of Photosensitive Resin Composition

Examples 1 to 15 and Comparative Examples 1 to 9

Photosensitive resin compositions of Examples 1 to 15 and Comparative Examples 1 to 9 were prepared by combining components in accordance with the formulation shown in Tables 1 and 2, agitating, mixing and dissolving them at room temperature.

TABLE 1

| Component | | Example | | | | | | | | | | | | | | | Comparative Example | |
|---|---|---|---|---|---|---|---|---|---|---|---|---|---|---|---|---|---|---|
| (pbw) | | 1 | 2 | 3 | 4 | 5 | 6 | 7 | 8 | 9 | 10 | 11 | 12 | 13 | 14 | 15 | 1 | 2 |
| (A) Silicone resin | Resin A-1 | 100 | | | | | | | | | | 100 | 100 | 100 | 100 | 100 | 100 | |
| | Resin A-2 | | 100 | | | | | | | | | | | | | | | |
| | Resin A-3 | | | 100 | | | | 100 | 100 | 100 | 100 | | | | | | | 100 |
| | Resin A-4 | | | | 100 | | | | | | | | | | | | | |
| | Resin A-5 | | | | | 100 | | | | | | | | | | | | |
| | Resin A-6 | | | | | | 100 | | | | | | | | | | | |
| (B) Photoacid generator | B-1 | 1 | 1 | 1 | 1 | 1 | 1 | 1 | 1 | 1 | 5 | 1 | 1 | 1 | 1 | 1 | 1 | 1 |
| (C) White pigment | titanium dioxide | 55 | 55 | 55 | 55 | 55 | 55 | 85 | 45 | 55 | 60 | 4 | 7 | 130 | 190 | | 55 | |
| | yttrium oxide | | | | | | | | | | | | | | | 55 | | |
| (D) Cross-linker | D-1 | 30 | | | 30 | | | 100 | | 30 | 30 | | | | | 30 | 30 | 30 |
| | D-2 | | 30 | | | 30 | | | | | | 30 | | 30 | | | | |
| | D-3 | | | 30 | | | 30 | | | | | | 30 | | 30 | | | |
| (E) Anti-oxidant | E-1 | 0.1 | 0.1 | 0.1 | 0.1 | 0.1 | 0.1 | 0.1 | 0.1 | | 0.1 | 0.1 | 0.1 | 0.1 | 0.1 | 0.1 | 0.1 | 0.1 |
| | E-2 | 0.1 | 0.1 | 0.1 | 0.1 | 0.1 | 0.1 | 0.1 | 0.1 | 0.1 | | 0.1 | 0.1 | 0.1 | 0.1 | 0.1 | 0.1 | 0.1 |
| (F) Solvent | cyclo-pentanone | 55 | 55 | 55 | 55 | 55 | 55 | 55 | 55 | 55 | 55 | 55 | 55 | 55 | 55 | 55 | 55 | 55 |

TABLE 2

| Component | | Comparative Example | | | | | | |
|---|---|---|---|---|---|---|---|---|
| (pbw) | | 3 | 4 | 5 | 6 | 7 | 8 | 9 |
| Resin | Acrylic Resin 1 | 50 | 50 | 50 | 100 | | 50 | 50 |
| | Acrylic Resin 2 | 50 | 50 | 50 | | 100 | 50 | 50 |
| Photo-initiator | Irgacure OXE02 | 1 | 1 | 1 | 1 | 1 | 1 | 1 |
| (C) White pigment | titanium dioxide | | 45 | 45 | 45 | 45 | 4 | 140 |
| (E) Antioxidant | E-1 | | | 0.1 | 0.1 | 0.1 | | |
| | E-2 | | | 0.1 | 0.1 | 0.1 | | |
| (F) Solvent | methyl ethyl ketone | 55 | 55 | 55 | 55 | 55 | 55 | 55 |

In Tables 1 and 2, titanium dioxide is titanium dioxide R-105 (siloxane compound surface-treated, average particle size 300 nm, titanium oxide content 92 wt %) available from Chemours Co. Yttrium oxide is yttrium oxide UU-Type (average particle size 300 nm) available from Shin-Etsu Chemical Co., Ltd. Photoacid generator PAG-1, crosslinkers D-1 to D-3, antioxidants E-1 and E-2, Acrylic Resin 2, and Irgacure OXE02 are identified below.

Photoacid Generator B-1

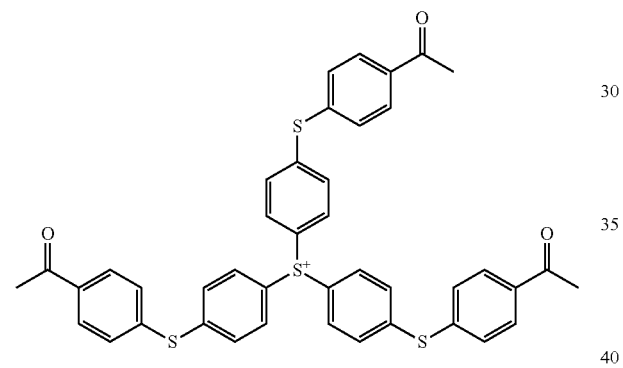

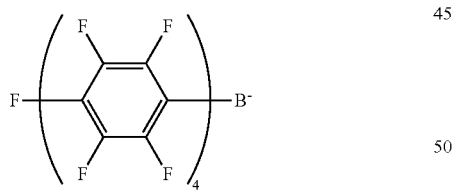

Crosslinker D-1 (Shin-Etsu Chemical Co., Ltd.)

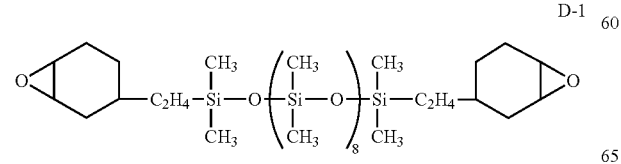

D-1

Crosslinker D-2 (Shikoku Chemicals Corp.)

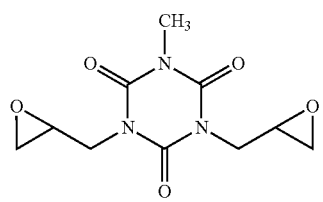

D-2

Crosslinker D-3 (Shikoku Chemicals Corp.)

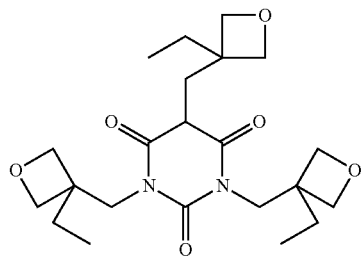

D-3

Antioxidant E-1: CHIMASSORB 119FL (BASF)
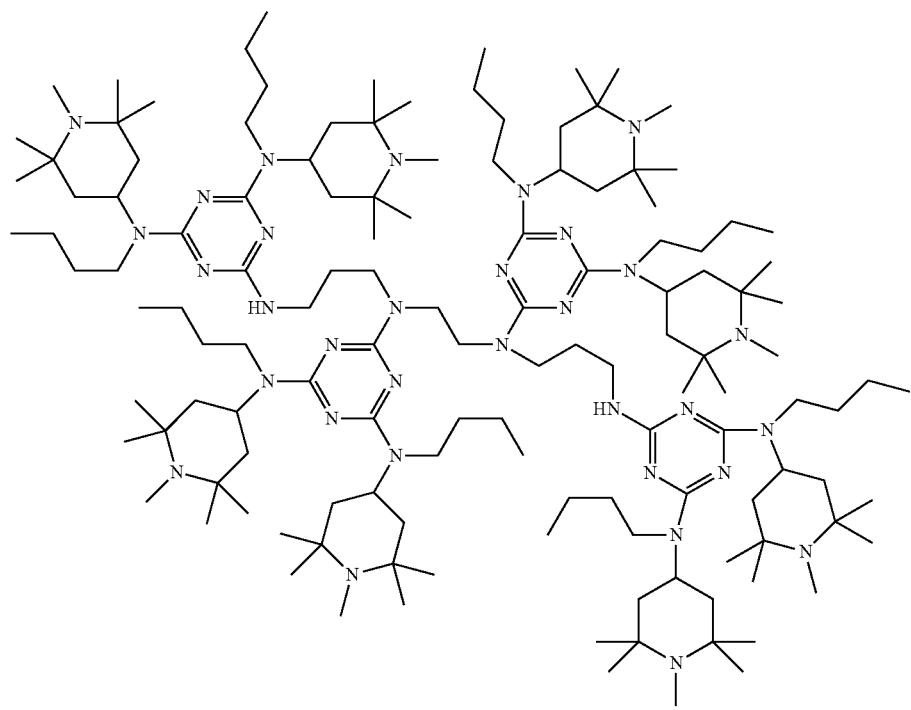 [SMILES: CCCCN(c1nc(NCCCN(CCN(CCCNc2nc(N(CCCC)C3CC(C)(C)N(C)C(C)(C)C3)nc(N(CCCC)C3CC(C)(C)N(C)C(C)(C)C3)n2)c2nc(N(CCCC)C3CC(C)(C)N(C)C(C)(C)C3)nc(N(CCCC)C3CC(C)(C)N(C)C(C)(C)C3)n2)c2nc(N(CCCC)C3CC(C)(C)N(C)C(C)(C)C3)nc(N(CCCC)C3CC(C)(C)N(C)C(C)(C)C3)n2)nc(N(CCCC)C2CC(C)(C)N(C)C(C)(C)C2)n1)C1CC(C)(C)N(C)C(C)(C)C1]
Antioxidant E-2: Irganox 3114 (BASF)
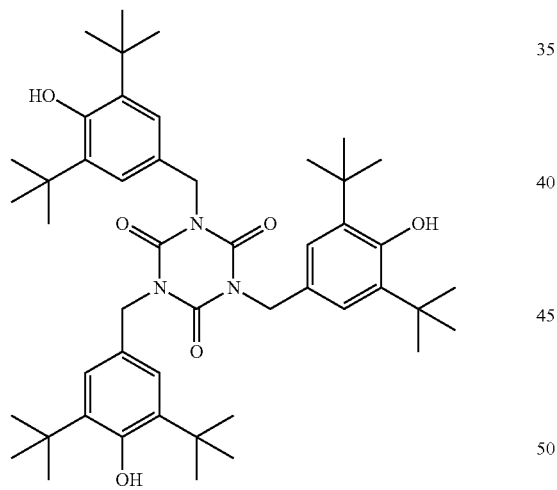
Acrylic Resin 2: Trade Name DPCA-20 from Nippon Kayaku Co., Ltd. (ε-caprolactone-modified dipentaerythritol acrylate)
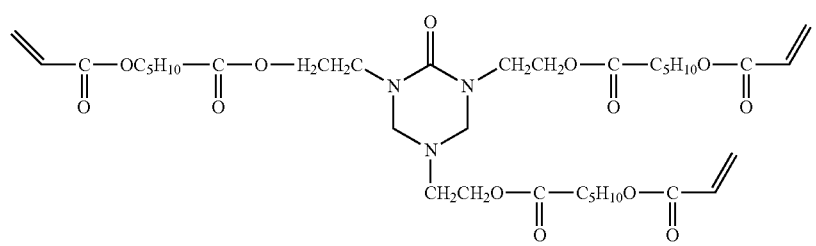

Irgacure OXE02: ethanone, 1-[9-ethyl-6-(2-methylbenzoyl)-9H-carbazol-3-yl]-, 1-(O-acetyloxime (BASF)

[4] Pattern Formation Test (1) Pattern Formation and Evaluation

Using a spin coater, each photosensitive resin composition was coated onto a glass substrate to a coating thickness of 10 μm. To evaporate off the solvent, the substrate was rested on a hotplate and heat dried at 110° C. for 3 minutes. Using a contact aligner exposure tool, the photosensitive resin coating was exposed to radiation of 365 nm through a mask having a line-and-space pattern and a contact hole pattern. After exposure, the resin coating was baked (PEB) on a hotplate at 120° C. for 3 minutes and cooled. This was followed by spray development in propylene glycol monomethyl ether acetate (PGMEA) for 300 seconds for forming a pattern of the resin coating.

The patterned photosensitive resin coating on the substrate was post-cured in an oven at 190° C. for 2 hours while the oven was purged with nitrogen. Under a scanning electron microscope (SEM), the contact hole patterns of 50 μm, 30 μm, 20 μm, 10 μm, and 5 μm were observed in cross section, with the minimum hole pattern in which holes extended down to the film bottom being reported as maximum resolution. From the cross-sectional photo, the contact hole pattern of 50 μm was evaluated for perpendicularity, and rated "⊚ (excellent)" for perpendicular pattern, "○ (good)" for slightly inversely tapered profile, "Δ (fair)" for inversely tapered profile, and "x (poor)" for opening failure.

(2) Evaluation of Reliability (Adhesion, Crack Resistance)

Each of the photosensitive resin coating-bearing substrates after pattern formation and post-cure in Test (1) was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed whether or not the resin coating peeled from the substrate and whether or not the resin coating cracked. The sample was rated "good" when all specimens did not peel or crack, "peeled" when one or more specimens peeled, and "cracked" when one or more specimens cracked.

(3) Flexibility Test

The film was wound on a spindle of diameter 5 mm, held for 10 seconds, and unwound. The winding/unwinding operation was repeated 10 times, after which the film was inspected for anomaly. An intact sample was rated "○ (good)" and a cracked or defective sample was rated "x (poor)".

(4) Light Reflectivity Measurement

A photosensitive resin film of 3 mm thick was formed from the photosensitive resin composition. Using a Mask Aligner MA8 (SUSS MicroTec AG), the resin film was exposed to light of wavelength 360 nm from a high-pressure mercury lamp. The film was PEB and dipped in PGMEA. The resin film which remained after these operations was then heated in an oven at 190° C. for 2 hours, yielding a cured film. The cured film was measured for initial reflectivity at wavelength 450 nm. The cured film was held at 150° C. for 300 hours, after which it was measured again for reflectivity at wavelength 450 nm. For this measurement, spectrophotometer X-Rite 8200 (X-Rite, Inc.) was used.

The results are shown in Tables 3 and 4.

TABLE 3

| | | Example | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Resin layer thickness (μm) | | 10 | 10 | 10 | 10 | 10 | 10 | 10 | 10 | 10 | 10 | 10 | 10 | 10 | 10 | 10 |
| Contact hole pattern shape | | ⊚ | ⊚ | ⊚ | ⊚ | ⊚ | ⊚ | ⊚ | ⊚ | ○ | ⊚ | ⊚ | ⊚ | ⊚ | ⊚ | ⊚ |
| Maximum resolution (μm) | | 10 | 10 | 10 | 10 | 10 | 10 | 10 | 10 | 10 | 10 | 5 | 5 | 20 | 20 | 10 |
| Light reflectivity @ 450 nm (%) | initial | 90 | 88 | 91 | 87 | 90 | 90 | 90 | 91 | 87 | 90 | 70 | 76 | 94 | 95 | 87 |
| | after 150° C. heating | 90 | 82 | 90 | 81 | 88 | 88 | 89 | 90 | 80 | 85 | 70 | 76 | 92 | 92 | 86 |
| Reliability | Peel | Good | Good | Good | Good | Good | Good | Good | Good | Good | Good | Good | Good | Good | Good | Good |
| | Crack | Good | Good | Good | Good | Good | Good | Good | Good | Good | Good | Good | Good | Good | Good | Good |
| Flexibility | | ○ | ○ | ○ | ○ | ○ | ○ | ○ | ○ | ○ | ○ | ○ | ○ | ○ | ○ | ○ |

TABLE 4

| | | Comparative Example | | | | | | | | |
|---|---|---|---|---|---|---|---|---|---|---|
| | | 1 | 2 | 3 | 4 | 5 | 6 | 7 | 8 | 9 |
| Resin layer thickness (μm) | | 10 | 10 | 10 | 10 | 10 | 10 | 10 | 10 | 10 |
| Contact hole pattern shape | | ⊚ | ⊚ | Δ | X | X | X | X | Δ | X |
| Maximum resolution (μm) | | 10 | 10 | 50 | — | — | — | — | 50 | — |
| Light reflectivity @ 450 nm (%) | initial | 0 | 0 | 0 | 80 | 86 | 88 | 87 | 70 | 94 |
| | after 150° C. heating | 0 | 0 | 0 | 65 | 77 | 79 | 78 | 66 | 84 |

TABLE 4-continued

| | | Comparative Example | | | | | | | | |
|---|---|---|---|---|---|---|---|---|---|---|
| | | 1 | 2 | 3 | 4 | 5 | 6 | 7 | 8 | 9 |
| Reliability | Peel | peeled | peeled | peeled | peeled | peeled | peeled | peeled | peeled | peeled |
| | Crack | cracked | cracked | cracked | cracked | cracked | cracked | cracked | cracked | cracked |
| Flexibility | | ○ | ○ | X | X | X | X | X | X | X |

As is evident from the results, the photosensitive resin compositions within the scope of the invention have good reliability with respect to adhesion and crack resistance, resolution, and flexibility. The cured films thereof have satisfactory light shielding properties in thin film form.

Japanese Patent Application No. 2018-134158 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising (A) an acid crosslinkable group-containing silicone resin, (B) a photoacid generator, and (C) a white pigment, wherein component (A) contains a silicone resin comprising recurring units having the formulae (A1) to (A6):

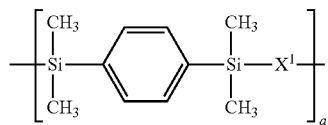
(A1)

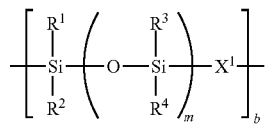
(A2)

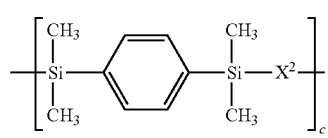
(A3)

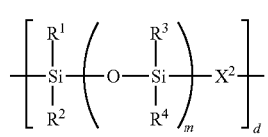
(A4)

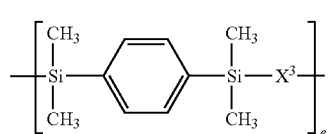
(A5)

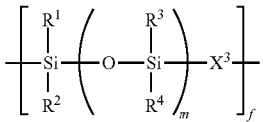
(A6)

wherein $R^1$ to $R^4$ are each independently a $C_1$-$C_{20}$ monovalent hydrocarbon group which may contain a heteroatom, m is each independently an integer of 1 to 600, groups $R^3$ may be the same or different and groups $R^4$ may be the same or different when m is an integer of at least 2, a, b, c, d, e and f are numbers in the range: $0 \leq a \leq 1$, $0 \leq b \leq 1$, $0 \leq c \leq 1$, $0 \leq d \leq 1$, $0 \leq e \leq 1$, $0 \leq f \leq 1$, $0 < c+d+e+f \leq 1$, and $a+b+c+d+e+f=1$, $X^1$ is a divalent group having the formula (X1):

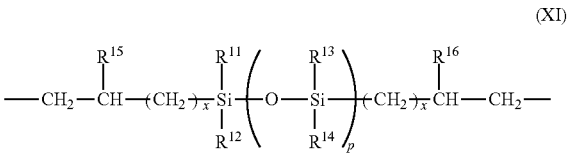
(X1)

wherein $R^{11}$ to $R^{14}$ are each independently a $C_1$-$C_{20}$ monovalent hydrocarbon group which may contain a heteroatom, p is an integer of 1 to 600, groups $R^{13}$ may be the same or different and groups $R^{14}$ may be the same or different when p is an integer of at least 2, $R^{15}$ and $R^{16}$ are each independently hydrogen or methyl, x is each independently an integer of 0 to 7, $X^2$ is a divalent group having the formula (X2):

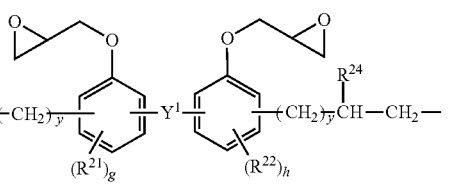
(X2)

wherein $Y^1$ is a single bond, methylene, propane-2,2-diyl, 1,1,1,3,3,3-hexafluoropropane-2,2-diyl or fluorene-9,9-diyl group, $R^{21}$ and $R^{22}$ are each independently a $C_1$-$C_4$ alkyl or alkoxy group, groups $R^{21}$ may be the same or different when g is 2, groups $R^{22}$ may be the same or different when h is 2, $R^{23}$ and $R^{24}$ are each independently hydrogen or methyl, y is each independently an integer of 0 to 7, g and h are each independently 0, 1 or 2, $X^3$ is a divalent group having the formula (X3):

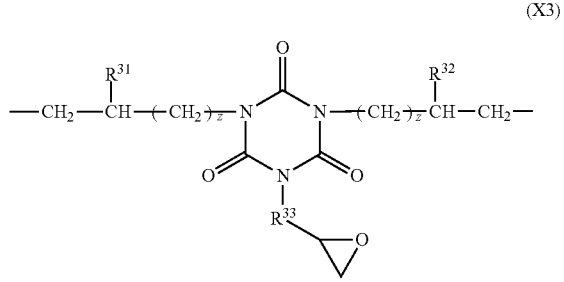

wherein $R^{31}$ and $R^{32}$ are each independently hydrogen or methyl, z is each independently an integer of 0 to 7, and $R^{33}$ is a $C_1$-$C_8$ divalent hydrocarbon group which may contain an ester bond or ether bond.

2. The photosensitive resin composition of claim 1 wherein the acid crosslinkable group is selected from epoxy, oxetane, and vinyl ether groups.

3. The photosensitive resin composition of claim 1 wherein $0<e+f\leq 1$.

4. The photosensitive resin composition of claim 1 wherein the white pigment (C) has an average particle size of up to 1 μm.

5. The photosensitive resin composition of claim 1 wherein the white pigment (C) is titanium dioxide which is surface treated with at least one compound selected from the group consisting of hydrous oxides of Al, Si and Zr, polyols, and organosilicon compounds.

6. The photosensitive resin composition of claim 1, containing 3 to 60% by weight of the white pigment (C).

7. The photosensitive resin composition of claim 1, further comprising (D) a crosslinker.

8. The photosensitive resin composition of claim 1, further comprising (E) an antioxidant.

9. The photosensitive resin composition of claim 1, further comprising (F) a solvent.

10. A pattern forming process comprising the steps of:
(i) coating the photosensitive resin composition of claim 1 onto a substrate to form a photosensitive resin coating thereon,
(ii) exposing the photosensitive resin coating to radiation, and
(iii) developing the exposed resin coating in a developer.

* * * * *